United States Patent [19]

Biegelsen

[11] 3,990,072

[45] Nov. 2, 1976

[54] ACOUSTIC RESIDUE ALGEBRA DECODER

[75] Inventor: David K. Biegelsen, Woodside, Calif.

[73] Assignee: Xerox Corporation, Stamford, Conn.

[22] Filed: Dec. 9, 1974

[21] Appl. No.: 530,899

[52] U.S. Cl. .......................... 340/347 DD; 235/154
[51] Int. Cl.$^2$ ........................................ H03K 13/00
[58] Field of Search ............. 340/347 AD, 347 DD; 324/83 D; 328/14; 313/483, 498; 315/55; 235/154

[56] References Cited
UNITED STATES PATENTS

| | | | |
|---|---|---|---|
| 2,945,984 | 7/1960 | Yando | 315/55 |
| 3,134,099 | 5/1964 | Woo | 340/347 AD |
| 3,202,868 | 8/1965 | Blank | 315/55 |
| 3,446,975 | 5/1969 | Adler et al. | 315/55 |
| 3,653,031 | 3/1972 | Hlady et al. | 340/347 AD |
| 3,701,147 | 10/1972 | Whitehouse | 340/347 DA |
| 3,824,586 | 7/1974 | Quate | 340/347 AD |

Primary Examiner—Thomas J. Sloyan
Attorney, Agent, or Firm—J. E. Beck; T. J. Anderson; A. W. Karambelas

[57] ABSTRACT

An acoustic residue algebra decoder having a plurality of acoustic channels with each channel having an input transducer and an output transducer. The number of acoustic channels is equal to the number of residue bases used in the decoder. An electrical signal is supplied to each input transducer of each acoustic channel with the frequency of the signal supplied channel with the frequency of the signal supplied being inversely proportional to the residue base of that acoustic channel. The spacing of the conductors of the input and output transducers of each acoustic channel are proportional to the residue base of that acoustic channel. Circuitry is provided in conjunction with the acoustic channels to provide a phase shift of each of the input signals with the degree of phase shifting being determined by the residue and the residue base. Additional circuitry is provided to determine the elapsed time between application of the input signals to the input transducers and the simultaneous generation of maximum signals from all the output transducers with this elapsed time being used to determine the coded number.

7 Claims, 2 Drawing Figures

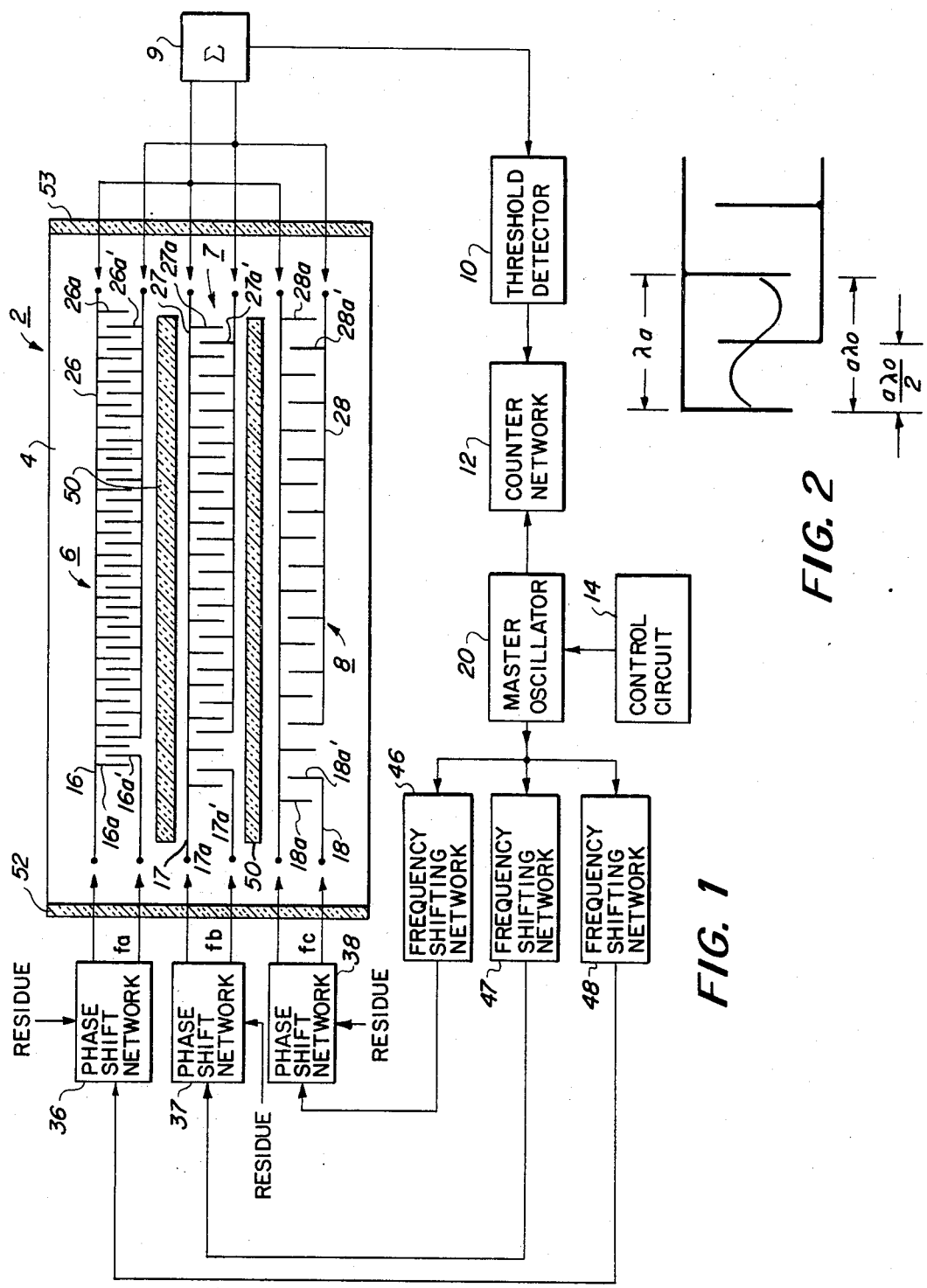

ACOUSTIC RESIDUE ALGEBRA DECODER

BACKGROUND OF THE INVENTION

Residue algebra is roughly defined as the algebra whose elements are numbers represented by m times some modulus plus a residue. For example, $17 = 4 \times 4 + 1$ which means that the residue of 17 is 1 base 4. Residue algebra may be quite useful in the future in that it allows for a great deal of parallel processing in computations. Numbers are entered into a calculator, encoded by assigning its residue relative to n relatively prime bases, operated upon and then decoded. Encoding and operating are relatively simple operations. However, there are substantial problems with automatic decoding.

OBJECTS OF THE INVENTION

It is an object of the present invention to provide an acoustic residue algebra decoder.

It is a further object of the present invention to provide an acoustic residue algebra decoder that automatically provides a decoding signal.

SUMMARY OF THE INVENTION

The invention is achieved by means of an acoustic surface wave device. In general, acoustic surface wave devices include a substrate of a material capable of propagating acoustic surface waves, with an input transducer and an output transducer which commonly take the form of interdigitated electrode fingers deposited on, or held in close proximity to, the substrate. With the application of an oscillating electrical signal to the input transducer, relatively slowly moving acoustic waves are set up in the substrate with the reconstruction of an electrical signal by the output transducer.

In accordance with the invention a plurality of essentially parallel acoustic channels are deposited on the acoustic wave propagating substrate with each channel having an input transducer section and an output transducer section, each comprised of interdigitated electrode fingers. The number of acoustic channels is equal to the number of bases used in the coding. The frequency of the electrical signal supplied to an input transducer of any acoustic channel is inversely proportional to the particular base associated with that channel and the spacing of the interdigitated electrode fingers of that channel is directly proportional to the particular base associated with that channel.

At a time $t_0$ each of the input transducers is supplied a single cycle of an electrical signal of a designated frequency with each signal having a phase shift equal to $2\pi$ times the residue divided by the base. The signals from each output transducer are periodic with a maximum amplitude A. If the outputs of all the acoustic channels are added, a maximum pulse having an amplitude equal to A times the number of channels will occur at a time $t - t_0$. When this maximum signal is detected by a threshold detector the time is recorded and used along with the acoustic wave velocity and the minimal separation between any two interdigitated electrode fingers to determine the coded number.

BRIEF DESCRIPTION OF THE DRAWINGS

FIG. 1 is a plane view of an acoustic residue algebra decoder in accordance with the invention.

FIG. 2 shows a portion of one acoustic channel of the device of FIG. 1 with a propagating surface wave also depicted.

DETAILED DESCRIPTION OF THE INVENTION

Referring to FIG. 1, there is shown my novel decoder 2 which includes a single crystalline or ceramic piezoelectric substrate 4 which may be, for example, lithium niobate, quartz, lead zirconate titanate, zinc oxide, cadmium sulfide, or other piezoelectric, high acoustic velocity substrate material known to those skilled in the art. A plurality of decoding elements are deposited on the surface of substrate 4 to define thereon separate, essentially parallel acoustic channels 6, 7 and 8. Each of the channels 6, 7 and 8 is comprised of an input transducer 16, 17 and 18, respectively, and a decoding-output transducer 26, 27 and 28, respectively.

The input and output transducers are each defined by an interdigitated array of electrode fingers deposited on the surface of substrate 4. The spacing of the adjacent electrodes is different for each channel as will be discussed hereinafter. The electrodes of the transducers may comprise aluminum, gold or other appropriate metals and may be formed on the substrate 4 by a conventional masking and etching metalization technique, or other conventional techniques of defining a metal pattern on a substrate. Conventionally, a layer of metal is formed on the surface of the substrate 4, followed by the deposition of a positive photoresist or electron resist layer over the metal layer. The photoresist or electron resist is then exposed optically through a mask or to a programmed electron beam having the desired electrode pattern, with the unexposed portion of the photoresist being removed. When exposed to an acid etchant, the metal not protected by the resist is removed to provide, after removal of the exposed resist, the desired electrode pattern.

The input transducer of each of the acoustic channels is coupled to a master oscillator via a gated, phase shift network and a frequency shifting network. Specifically, the input transducer 16 is coupled through a gated, phase shift network 36 and a frequency shifting network 48 to a master oscillator 20, the input transducer 17 is coupled through a gated, phase shift network 37 and a frequency shifting network 47 to oscillator 20, and the input transducer 18 is coupled through a gated, phase shift network 38 and a frequency shifting network 46 to master oscillator 20. The frequency of the signal supplied by each of the frequency shifting networks is inversely proportional to the base of its associated acoustic decoding channel, as will be discussed hereinafter. Each of the networks 36, 37 and 38 supply a single cycle of the signal supplied thereto by its associated frequency shifting network with each signal being phase shifted in accordance with the residue of the number to be decoded and the decoding base, as will be discussed hereinafter. The master oscillator 20 is turned on by control circuit 14. The acoustic pulses should travel only from input or transmitting transducers to output transducers and then be absorbed in acoustic absorbing layer 53. Back transmitted energy is absorbed by acoustic absorber 52.

The output signals from the output transducers 26, 27 and 28 are coupled through a summing network 9 to a threshold detector 10 which will pass a control signal to a counter network 12 only when maximum amplitude signals are generated simultaneously by all three of the output transducers 26, 27 and 28. The signal $f_0$ supplied by the master oscillator 20 is also supplied to counter 12 which counts the number of periods of this signal until receipt of the control signal from detector 10 to thereby provide the decoded number.

The device of FIG. 1 can be used to decode a group of numbers with the magnitude of the group of numbers being determined by the product of the bases of the acoustic channels 6, 7 and 8. For example, if the channels 6, 7 and 8 have the bases 2, 3 and 5, respectively, the device of FIG. 1 can decode 30 numbers, that is, $2 \times 3 \times 5$. As noted, the spacing of the electrodes of each acoustic channel is determined by the base associated with that channel. If channel 6 is to decode the lowest order base $a$ then the spacing between electrodes 16a and 16a' and 26a and 26a' would be equal to $(a) (\lambda_o/2)$ where $\lambda_o/2$ is the half wavelength distance of the signal propagating in channel 6. Likewise, if channels 7 and 8 are to decode the bases $b$ and $c$, respectively, then the spacing between electrodes 17b and 17b' and 27b and 27b' would be equal to $(b) (\lambda_o/2)$, and the spacing between electrodes 18c and 18c' and 28c and 28c' would be $(c) (\lambda_o/2)$. The distance $(\lambda_o/2)$ is arbitrary, but in order to provide for a minimum size of the device 2, is preferably chosen so that the lowest order interelectrode distance $(a) (\lambda_o/2)$ is the smallest interelectrode repeat distance achievable by the state of the art interdigital electrode deposition techniques previously described. For example, if it is possible to deposit interdigital electrodes with a repeat distance for adjacent electrodes of 0.5 microns, using 0.5 microns as the spacing constant $(a) (\lambda_o/2)$ and 2, 3, and 5 as the bases $a$, $b$, $c$, respectively, the spacing between electrodes 16a and 16a' and 26a and 26a' would be $(a) (\lambda_o/2)$ or $2 \times 0.5$ micron (1 micron), the spacing between electrode 17a and 17a' and 27a and 27a' would be $(b) (\lambda_o/2)$ or $3 \times 0.5$ micron (1.5 microns), and the spacing between electrodes 18a and 18a' and 28a and 28a' would be $(c) (\lambda_o/2)$ or $5 \times 0.5$ micron (2.5 microns).

The frequency of the input signals supplied by each of the networks 46, 47 and 48 is inversely proportional to the base of its associated acoustic channel. Referring to FIG. 2, it is necessary that the surface wave propagating in the acoustic channel 6 (the lowest order base $a$ channel) have a wavelength equal to $\lambda_a$ or some integer multiple of $\lambda_a$ since that wavelength will provide points along transducer 26 which have a maximum coupling with the surface wave in channel 6. As shown in FIG. 2, with the acoustic wave 56 having a wavelength of $\lambda_a$ it will have an algebraically, i.e. same sign, maximum coupling with transducer 26 when in the position shown and each time that the wave goes through a phase shift of $2\pi$ degrees. Since the wavelength $\lambda_a$ of the propagating surface wave in channel $a$ is related to the frequency $f_a$ of the propagating wave in channel $a$ according to the relationship $f_a \lambda_a = V$ where $V$ is the velocity of the propagating wave in the substrate, then the frequency $f_a$ of the input wave is equal to the velocity of the propagating wave in substrate 4 divided by $\lambda_a$. Expressed in accordance with the smallest interelectrode repeat distance $(a) (\lambda_o/2)$, the frequency $f_a$ of the signal supplied by network 46 is equal to $v/\lambda_a = V(a) (\lambda_o)$, where $v$, $a$ and $\lambda_o$ are as previously noted. Likewise, the frequency $f_b$ of the signal produced by oscillator 47 is equal to V divided by $(b) (\lambda_o)$ and the frequency $f_c$ of the signal supplied by oscillator 48 is equal to $v$ divided by $(c) (\lambda_o)$. Expressed differently, the frequency supplied by networks 46, 47 and 48 are equal to $(f_o/a)$, $(f_o/b)$ and $(f_o/c)$ respectively, where $f_o$ is equal to $V$ divided by $\lambda_o$ and $a$, $b$ and $c$ are the bases of channels 6, 7 and 8, respectively. Using $(a) (\lambda_o)$ as 1.0 micron and $V$ as 3,000 microns per microsecond, $f_o$ is equal to 3,000 microns per microsecond divided by 1.0 micron and $f_a$ is equal to 1.5GHz, $f_b$ is equal to 1.0GHz, and $f_c$ is equal to 0.60GHz, where the bases $a$, $b$ and $c$ are 2, 3 and 5, respectively.

In operation, circuit 14 supplies a starting pulse which gates on master oscillator 20 at time $t_0$ when oscillator 20 is at a voltage peak. Networks 46, 47 and 48 divide the frequency of the master oscillator signal to supply phase locked signals of frequencies $f_a$, $f_b$ and $f_c$ to networks 36, 37 and 38, respectively. The master oscillator signal is also supplied to counter 12 at time $t_0$. The signal from the networks 46, 47 and 48 undergo a phase shift equal to $2\pi$ times the residue of the number to be decoded divided by the base. For example, if the bases $a$, $b$ and $c$ are 2, 3 and 5, respectively, and the number to be decoded is 17, the residue of channel 6 is 1 ($8\times\underline{2}+1$), the residue of channel 7 is 2 ($5\times\underline{3}+2$), and the residue of channel 8 is 2 ($3\times\underline{5}+2$) where the underscored number is the base. Since the residue is known for each channel, the amount of phase shift is provided by each of the networks 36, 37 and 38 (in accordance with the residue number supplied thereto and the phase shift formula given), and the appropriately phase shifted signal is supplied to the input transducers 16, 17 and 18. As the soundwaves produced by the excitation of the input transducers propagate down the associated output transducers, each output transducer cyclically has maximum coupling with the acoustic wave in its channel and produces a signal having a periodic maximum amplitude A. The threshold detector is biased to produce an output signal when the input signal thereto is greater than $(n-1)$ times A where $n$ is the number of channels. As the waves propagate in the respective channels, a point occurs where each of the channels simultaneously produces a signal having maximum amplitude A and these signals are summed in the summing network, providing a signal $(n) (A)$ which is sufficient to trigger threshold detector 10 and stop counter 12 at time $t$, thus providing the elapsed time $t - t_0$ for all three transducers to provide simultaneously a maximum output signal. Using the elapsed time, the decoded number N is computed using the formula $N = (t - t_0) V/\lambda_o$ where $V$ and $\lambda_o$ are as previously noted. The counter 12 can be quantized so that its output is an integer N with the counter performing the calculation of N in accordance with the formula $N=(t-t_0)V/\lambda_o=(t-t_0)f_o$.

In a distance L, the device of FIG. 1 can decode up to $L/\lambda_o$ numbers with a maximum access time of $L/V$. Using the numbers given above, a length of acoustic material 1 cm long can decode any of 10,000 numbers in 3.3 microseconds. As the state of the art of interdigitated electrode deposition advances, the electrodes can be moved closer with the decoding of more numbers possible within a given length of acoustic material.

The fact that the channel frequencies are relatively incommensurate allows one to neglect the matter of crosstalk. To avoid problems of energy spread the acoustic pulses can be wave-guided by depositing strips 50 of insulating material, e.g. glass, having higher acoustic velocity than the substrate on both sides of each channel, or by etching or ion milling grooves on both sides of each channel.

Parallel processing of acoustic waves in the highest base channels, i.e., all but the lowest two $a$ and $b$ channels, can be provided by fabricating $c$ channels for base $c$, each only $(a)(b)(\lambda_o)$ long, and providing each channel with phase shift $[\phi +(m/c)]$ where $m$ ranges from 0 to $(c-1)$. Only one of the $c$ channels will have an output in the $(a)(b)$ cycles of oscillator $f_o$. The encoded number is then simply related to the time of the output $(t-t_o)$ and the phase shift of the channel which had the output. Similar "folding" of all channels greater than $b$ reduces the access time of the device to $(a)(b)$ cycles of $f_o$.

What I claim is:

1. A decoder for decoding a group of numbers with the magnitude of the group being determined by selected residue base numbers comprising:
   a substrate of a material capable of propagating acoustic surface waves,
   a plurality of acoustic channels supported by said substrate, each said acoustic channel being associated with a different one of said residue bases and being comprised of an input transducer of interdigitated electrodes and an output transducer of interdigitated electrodes, the spacing of the electrodes of each of said acoustic channels being proportional to the residue base associated with that acoustic channel,
   first means for supplying an oscillatory electrical signal of a different frequency and phase to each of said input transducers, the frequency and phase of the input signal supplied to each input transducer being proportional to the residue base associated with the acoustic channel of which that input transducer forms a part, and
   second means for detecting when said oscillatory electrical signals produce simultaneously a pulse of maximum amplitude in each of said output transducers to thereby provide for decoding of one of said group of numbers by means of a counter which is started upon application of said oscillatory electrical signals and which is stopped when said oscillatory electrical signals produce simultaneously said pulse of maximum amplitude.

2. The decoder of claim 1 wherein each of said oscillatory electrical signals supplied by said first means has a frequency inversely proportional to the base of the channel to which the signal is supplied.

3. The decoder of claim 1 wherein each of said oscillatory electrical signals supplied by said first means has a phase inversely proportional to the residue base of the channel to which the signal is supplied.

4. The decoder of claim 2 wherein each of said oscillatory electrical signals supplied by said first means has a phase inversely proportional to the residue base of the channel to which the signal is supplied.

5. The decoder of claim 1 wherein said second means includes detector means and associated clock means for determining the time elapsed between the application of said electrical signals to said input transducers and the simultaneous production of maximum output signals in each of said output transducers.

6. The decoder of claim 4 wherein said second means includes detector means and associated clock means for determining the time elapsed between the application of said electrical signals to said input transducers and the simultaneous production of maximum output signals in each of said output transducers.

7. A decoder for decoding a group of numbers with each number represented by $n$ residue bases with a residue number for each base comprising:
   a substrate of a material capable of propagating acoustic surface waves,
   a plurality of acoustic channels supported by said substrate, the number of channels being equal to $n$, each of said channels being comprised of an input transducer of interdigitated electrodes and an output transducer of interdigitated electrodes, the spacing of the interdigitated electrodes of each channel being different with the spacing of the electrodes of each channel being proportional to a different one of said $n$ residue bases,
   first means for supplying an oscillatory electrical signal to each of said channels, the frequency of the signal supplied to each of said channels being inversely proportional to a different one of said $n$ residue bases, and the phase of the signal supplied to each of said channels being inversely proportional to a different one of said $n$ residue bases and directly proportional to the residue number of the one of said $n$ residue bases, and
   second means for detecting when said oscillatory electrical signals produce simultaneously a pulse of maximum amplitude in each of said output transducers to thereby provide for decoding of one of said group of numbers by means of a counter which is started upon application of said oscillatory electrical signals and which is stopped when said oscillatory electrical signals produce simultaneously said pulse of maximum amplitude.

\* \* \* \* \*